United States Patent [19]

Evans

[11] 4,110,693
[45] Aug. 29, 1978

[54] LOCKUP INHIBITING ARRANGEMENT FOR A PHASE LOCKED LOOP TUNING SYSTEM

[75] Inventor: Wayne Wheeler Evans, Carmel, Ind.

[73] Assignee: RCA Corporation, New York, N.Y.

[21] Appl. No.: 762,107

[22] Filed: Jan. 24, 1977

[51] Int. Cl.² .......................... H04N 5/50; H04B 1/26
[52] U.S. Cl. .................................. 325/419; 325/423; 325/459; 358/193
[58] Field of Search ............... 325/419, 420, 421, 423, 325/453, 459, 458, 464, 470, 422; 358/193, 195; 331/10, 14, 15, 17, 18

[56] References Cited

U.S. PATENT DOCUMENTS

| | | | |
|---|---|---|---|
| 3,480,865 | 11/1969 | Sanders | 325/419 |
| 3,626,301 | 12/1971 | Develet, Jr. | 325/422 |
| 3,697,885 | 10/1972 | Avins | 325/422 |
| 3,769,602 | 10/1973 | Griswold | 325/419 |
| 3,805,192 | 4/1974 | Ocnaschek et al. | 325/419 |
| 4,000,476 | 12/1976 | Walker | 325/419 |
| 4,009,439 | 2/1977 | Rast | 325/459 |
| 4,031,549 | 6/1977 | Rast et al. | 325/419 |

Primary Examiner—Robert L. Griffin
Assistant Examiner—Tommy P. Chin
Attorney, Agent, or Firm—Eugene M. Whitacre; Paul J. Rasmussen; Peter M. Emanuel

[57] ABSTRACT

In a phase locked loop tuning system for a television receiver including a frequency divider for prescaling the frequency of a local oscillator signal generated by a controlled oscillator, a lockup inhibiting arrangement is provided for causing the controlled oscillator to temporarily oscillate at a frequency for which the amplitude of the local oscillator signal is sufficiently high to overcome any self-oscillation of the prescaler before phase locked loop control is enabled whenever the receiver is initially turned on or when a channel in a new band is selected.

16 Claims, 1 Drawing Figure

U.S. Patent  Aug. 29, 1978  4,110,693
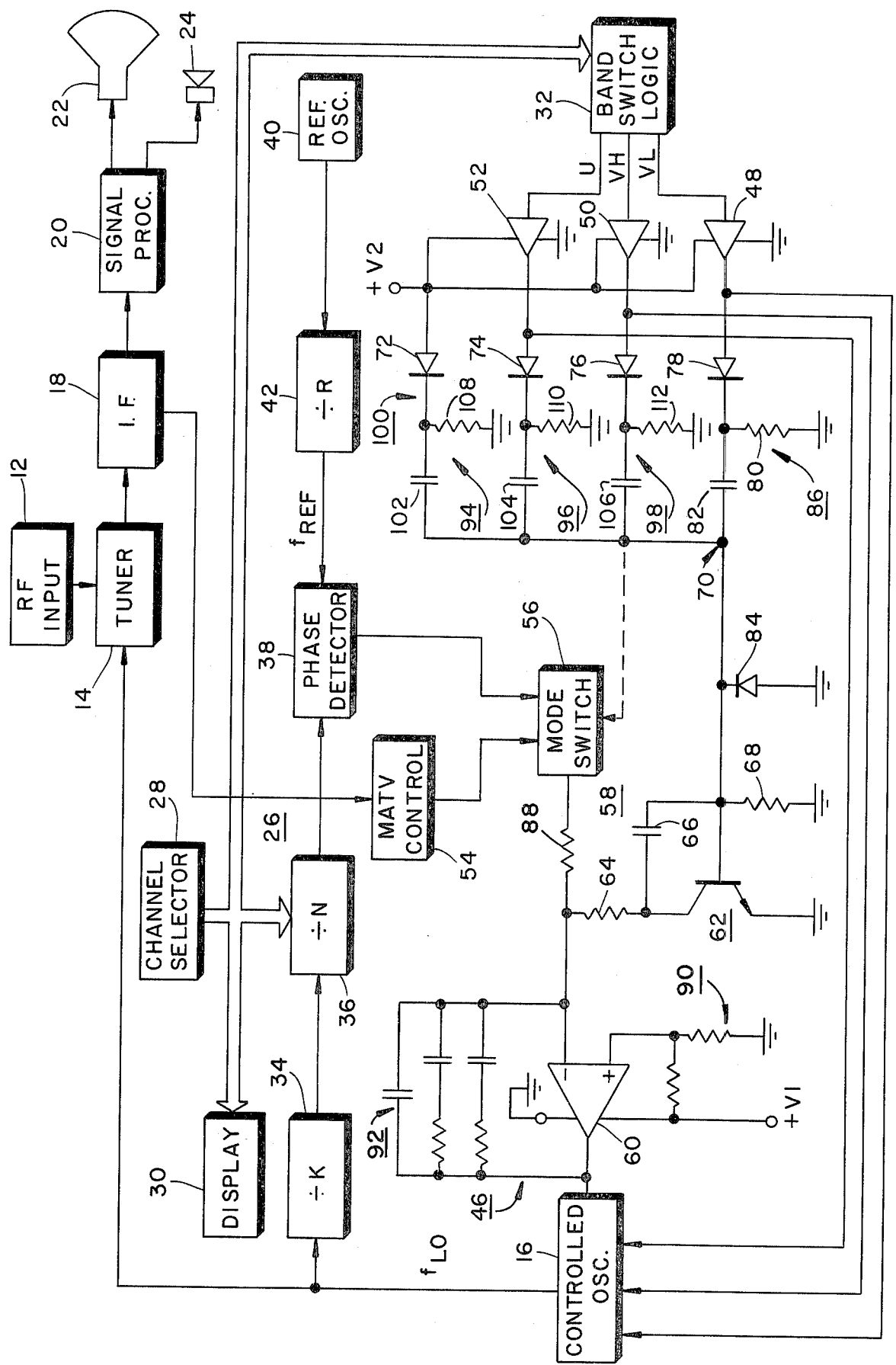

LOCKUP INHIBITING ARRANGEMENT FOR A PHASE LOCKED LOOP TUNING SYSTEM

BACKGROUND OF THE INVENTION

The present invention relates to the field of electronic tuning systems for television receivers and the like including provisions to inhibit the tuning system from locking up on spurious signals generated by the system itself under certain operating conditions.

Electronic tuning systems for radio and television receivers have recently been developed which utilize a voltage controlled oscillator, typically of the varactor diode type, the frequency of which is adjusted in response to a control signal to provide the local oscillator frequency appropriate for tuning a selected station or channel. Although these systems are typically less failure-prone than are their mechanical counterparts, portions of the tuning system may generate spurious signals under certain operating conditions which cause the tuning system to lock up. In U.S. Pat. No. 3,971,991 entitled, "Television Tuning System with Varactor Malfunction Detection", issued in the name of A. Tanaka on July 27, 1976 there is described a tuning system in which the local oscillator signal generated by a varactor controlled oscillator has its frequency in response to a ramp voltage until a counter responsive to the local oscillator signal accumulates the appropriate count for a selected channel. Under some varactor operating conditions, the varactor controlled oscillator signal output may be weak or intermittent and as a result the accumulated count may be erroneously low. In order to inhibit the tuning system from becoming locked up at a local oscillator frequency corresponding to an erroneous count, a comparator to determine the actual count and the desired count and a malfunction detector to drive the varactor controlled oscillator in a direction opposite to that indicated by the comparator are provided.

To simplify this structure, it is desirable that lockup inhibiting provisions in electronic tuning systems automatically prevent lockups due to the generation of spurious signals when they are likely to occur, rather than taking corrective action after the lockups have occurred.

SUMMARY OF THE INVENTION

In a tuning system including controlled oscillator means for generating a local oscillator signal having a frequency corresponding to a control signal and being susceptible to generating a spurious signal component to which the tuning system may undesirably respond during at least one operating condition when tne amplitude of the local oscillator is relatively small, lockup inhibiting means are provided for temporarily controlling the control signal in a predetermined manner in response to the occurrence of the predetermined operation condition to cause the local oscillator signal to have a frequency at which its amplitude is sufficiently large so that the tuning system responds to it rather than the spurious signal component.

DETAILED DESCRIPTION OF THE PREFERRED EMBODIMENT

Reference should now be made to the drawing consisting of a sole FIGURE in which there is shown, partially in block diagram form and partially in schematic diagram form, a tuning system for a television receiver including a lockup inhibiting provision constructed in accordance with the present invention.

Radio frequency (RF) carriers provided by an RF input unit 12 are coupled to a tuner 14 of the receiver where they are combined with a local oscillator signal having the appropriate frequency for receiving the RF carrier associated with a selected channel to form an intermediate frequency (IF) signal. The local oscillator signal is generated by a controlled oscillator 16 including an array of varactor diodes. Selected ones of the varactor diodes are enabled in response to band switching signals, depending on the band in which the selected channel resides, to determine the range of oscillation. The enabled varactor diodes are biased by a control voltage, depending on the selected channel, to determine the specific frequency of oscillation. The IF signal is coupled to an IF stage 18 where it is filtered and otherwise processed to form color, luminance, synchronization and sound signal components. These components are coupled to signal processing portions of the receiver designated as 20 which serve to provide visual and corresponding audio information by means of a kinescope 22 and a speaker 24. Circuits of the type disclosed in the RCA Television Service Data, File 1975 C-10 for the CTC-74 published by RCA Corporation, Indianapolis, Indiana, hereby incorporated by reference, may be suitably employed in the portions of the receiver so far described.

The control signal for local oscillator 16 is generated by a phase locked loop 26 in accordance with binary coded signals representing the selected channel coupled to it from a channel selector keyboard 28. To provide a visual indication of the channel selected, the binary coded signals are coupled to a display unit 30. The binary coded signals are also coupled to a bandswitching logic control unit 32 which generates a VL bandswitching signal when the selected channel is in the lower VHF range (e.g., in the U.S. channels 2-6), a VH bandswitching signal when the selected channel is in the higher VHF range (e.g., in the U.S. channels 7-13) and a U bandswitching signal when the selected channel is in the UHF range (e.g., in the U.S. channels 14-83). The bandswitching signals are amplified by respective amplifiers 48, 50 and 52 and coupled to oscillator 16 to control its range of oscillation.

The local oscillator signal generated by local oscillator 16 is successively coupled to a divide-by-K prescaler 34, a programmable divide-by-N divider 36 and a phase detector 38 of phase locked loop 26. The factor K by which prescaler 34 divides the frequency of the local oscillator signal is selected to accommodate the operating frequency range of the components of phase locked loop 26 to which it is successively coupled. The factor N by which programmable divider 36 divides is controlled in accordance with the binary coded signals representing the number of the selected channel number, each channel number having a different factor N associated with it.

Also coupled to phase detector 38 is a reference frequency signal developed by a reference oscillator 40 and a divide-by-R divider 42 provided to divide the frequency of the output signal of reference oscillator 40 by a factor R, usually equal to the factor K, to accommodate the operating frequency range of phase locked loop 26. The output of phase detector 38 represents the phase and frequency deviation between its two input signals and generally has the form of a pulse signal comprising individual pulses having widths which vary with the phase and frequency deviation between the input signals of phase detector 38. The output of phase detector 38 is normally coupled by a mode switch 56 (the function of which will later be explained) to an active low pass filter 46 which removes the relatively high frequency pulse components from it and develops the substantially DC control voltage for the local oscillator 16. For a selected channel, local oscillator 16 is controlled in response to its control signal until there is substantially no phase and frequency error between the two inputs of phase detector 38. At this point, the local oscillator frequency $f_{LO}$ is related to the reference frequency $f_{REF}$ by the following relationship:

$$f_{LO} = NK/Rf_{REF} \tag{1}$$

Assuming that an RF carriers has the standard frequency assigned to it, the local oscillator signal required to precisely tune the receiver to the channel is synthesized by tuning system 26. Generally, RF input unit 12 is coupled to a conventional antenna for receiving standard frequency broadcast carriers. However, RF input unit 12 may also be coupled to a system such as a master antenna television (MATV) distribution system which translates the frequencies of RF carriers to nonstandard frequencies arbitrarily near respective standard frequencies. In order to tune the receiver to carriers having nonstandard frequencies, an MATV tuning control unit 54 is provided for generating an MATV control signal for controlling the frequency of the local oscillator to reduce a deviation between the actual frequency of the picture carrier of the IF signal and its nominal value (e.g., in the U.S., 45.75 MHz) corresponding to a frequency offset between a standard frequency carrier and a nonstandard frequency carrier. The MATV control signal generated by MATV control unit 54 is selectively coupled to controlled oscillator 16 instead of the control signal phase locked loop tuning system 26 in accordance with a predetermined tuning algorithm when nonstandard frequency carriers are being provided by RF input unit 12.

Various phase locked loop tuning systems with nonstandard frequency tuning provisions similar to the one so far described are disclosed in U.S. patent applications: Ser. No. 632,060 entitled, "Television Frequency Synthesizer for Nonstandard Frequency Carriers", filed in the name of J. G. N. Henderson on Nov. 14, 1975 now abandoned having a continuation application thereof Ser. No. 751,924 filed Dec. 16, 1976; Ser. No. 662,096 entitled, "Dual Mode Frequency Synthesizer for a Television Tuning Apparatus", filed in the name of R. M. Rast on Feb. 27, 1976 now abandoned having continuation application thereof Ser. No. 758,294 filed Jan. 10, 1977; and Ser. No. 688,521 entitled, "Television Tuning System with Provisions for Receiving RF Carrier at Nonstandard Frequency", filed in the name of J. G. N. Henderson et al on May 21, 1976 now issued as U.S. Pat. No. 4,031,549 all of which are hereby incorporated by reference.

Portions of phase locked loop tuning system 26 may be susceptible to generating spurious oscillations or other undesired signal components. For example, because high speed frequency dividers which may be employed as divide-by-K prescaler 34 typically include high gain devices to sufficiently amplify the relatively low amplitude local oscillator signals and a relatively large number of binary stages to sufficiently divide the frequency of the local oscillator signal (e.g., by 64 in the VHF bands and by 246 in the UHF band) arranged in a counter configuration with at least one feedback path, they are susceptible to generating self-oscillation signals. These self-oscillation signals typically occur between the mid and upper portions of a local oscillator frequency band and most often have been found to occur in the mid portion of the UHF local oscillator band frequencies, e.g., at a frequency corresponding to channel 40 in the United States. Although the self-oscillations of prescaler 34 can and do occur at any time, they tend not to adversely affect the operation of phase locked loop 26 as long as the amplitude of the local oscillator signal is sufficiently large so that the local oscillator signal predominates any self-oscillation signal generated by divide-by-K prescaler 34. Under these conditions, phase locked loop 26 responds to the local oscillator signal and controls it in the manner set forth above and essentially does not respond to the self-oscillation signal.

However, under certain operating conditions, such as when the receiver is turned on or when a new band is selected so that controlled oscillator 16 is enabled to oscillate after it has been in an off or non-oscillating state, phase locked loop 26 may lock up on a self-oscillation signal generated by prescaler 34. For example, when a new band is selected, the control voltage does not immediately begin to respond to the phase and frequency difference between the divide-by-N output signal and the divide-by-R output signal but rather begins to rise from a relatively low off level due to the time constants associated with the various components of phase locked loop 26. The frequency of oscillation of varactor controlled oscillators such as controlled oscillator 16 is directly related to the amplitude of the control voltage. Moreover, the amplitude of the signal generated by controlled oscillator 16 is directly related to the frequency of oscillation. Therefore, when a new band is selected, controlled oscillator 16 produces a local oscillator signal having a relatively low frequency near the lowest frequency in the band and a relatively low amplitude.

Under these conditions, when the new band is selected, assuming that the frequency of the self-oscillation signal corresponds to a frequency above the frequency of the local oscillator signal initially generated and that the local oscillator signal has an amplitude so low that the local oscilaltor signal is masked by the self-oscillation signal, phase locked loop 26 will lock up on the self-oscillation frequency because, for the selected value of N, phase detector 38 will respond to the self-oscillation signal of prescaler 34 rather than the signal generated by controlled oscillator 16. As a result, phase detector 38 will generate a signal indicating that the local oscillator signal has a frequency which is too high when it is actually too low. In response, the control signal will incorrectly be driven lower rather than higher, as it should be, and the frequency of the controlled oscillator 16 will be driven still lower. The now lower frequency local oscillator signal has a lower amplitude which is even less likely to dominate over the self-oscillation of prescaler 34 than does the local oscillator signal initially generated when the new band was selected and as a result, phase locked loop 26 is locked up on the erroneously high self-oscillation frequency of prescaler 34.

In order to inhibit the development of a lock up condition due to the self-oscillation of prescaler 34, whenever the receiver is turned on and power is initially applied to its circuits or when a channel in a new band is selected, a lockup inhibiting circuit 58 initially causes the control voltage of low pass filter 46 to temporarily rise to a predetermined level corresponding to a frequency in the high end of the band in which the selected channel resides. The initial frequency is selected such that the amplitude of the local oscillator signal is high enough to dominate any self-oscillation signal of prescaler 34. After a relatively short time interval, well within the acquisition time of phase locked loop 26, i.e., the time required for expression (1) to be satisfied, the action of lockup inhibiting circuit 58 is terminated and the control signal generated by low pass filter 46 is allowed to respond to the control of phase locked loop 26 in the normal manner set forth above. Because the operation of phase locked loop 26 begins at a point at which the local oscillator signal predominates any self-oscillation of prescaler 34 so that the actual local oscillator signal is not masked by the self-oscillation signal, the control voltage will change in the proper direction to correct the local oscillator frequency until expression (1) is satisfied.

Specifically, lockup inhibiting circuit 58 of the sole FIGURE comprises an NPN transistor 62 arranged in a common emitter configuration having its collector coupled through a load resistor 64 to the inverting (−) input of operational amplifier 60 included in active low pass filter 46 and its emitter coupled to ground. A timing capacitor 66 is coupled between the collector and base of transistor 62. The base of transistor 62 is coupled to an output terminal 70 of an OR configuration 100. The source of positive supply voltage, +V2, for amplifiers 48, 50 and 52 and the outputs of amplifiers 52, 50 and 48 are coupled to respective inputs of the OR configuration 100. The inputs of OR configuration 100 are respectively coupled to output terminal 70 through networks 94, 96, 98 and 86. Network 86 includes a diode 78 and a capacitor 82 connected in series between the output of amplifier 48 and output terminal 70 and a bleeder resistor 80 for capacitor 82 connected in shunt with the junction of diode 78 and capacitor 82. Network 98, including diode 76, capacitor 106 and resistor 112; network 96, including diode 74, capacitor 104 and resistor 110; and network 94, including diode 72, capacitor 102 and resistor 108 are arranged in the same manner as network 86. Capacitors 102, 104, 106 and 82 in combination with a resistor 68 coupled between the base and emitter of transistor 62 comprise separate differentiating circuits. A diode 84 is coupled between the base and emitter of transistor 62 and poled to protect the base-emitter of transistor 62 from excessively large (e.g., greater than approximately 0.7 volts) negative signals.

When the receiver is turned on, the power supply voltage for amplifiers 48, 50 and 52 rises to a value +V2 and a positive-going step-like signal is coupled through conductive diode 72 to the differentiating circuit comprising capacitor 102 and resistor 68 where it is differentiated to form a positive-going pulse and a negative-going pulse. The positive-going pulse is coupled to the base of transistor 62 but the negative-going pulse is clipped off when diode 84 is rendered conductive in response to it. Similarly, when a channel in a new band is selected, a positive-going step signal is generated at the output of its respective amplifier 48, 50 or 52 and a corresponding positive-going pulse is coupled to the base of transistor 62.

When power is initially turned on or when a new band is selected, and the control signal for controlled oscillator 16 is incorrectly low in response to a dominant self-oscillation signal of prescaler 34, for the reasons previously described, the corresponding signal developed at the inverting (−) input of operational amplifier 60 is high. Therefore, when a positive-going pulse is coupled to the base of transistor 62, transistor 62 is properly biased to be rendered conductive in response to it. When transistor 62 is rendered conductive, the voltage developed at the inverting (−) input of operational amplifier 60 is reduced in accordance with the voltage division of the network including the impedance seen at the output of mode switch 56, a gain determining resistor 88 of operational amplifier 60 and load resistor 64. The value of resistor 64 is selected with respect to the values of the impedance presented at the output of mode switch 56 and resistor 88 such that the voltage coupled to the inverting (−) input of operational amplifier 60 when transistor 62 is initially rendered conductive is sufficiently less than the voltage coupled to the noninverting (+) input of operational amplifier 60 from the source of positive supply voltage, +V1, by voltage divider network 90. As a result, the control voltage developed at the output of operational amplifier 60 is initially driven toward supply voltage +V1 when transistor 62 is rendered conductive. In response, controlled oscillator 16 is forced to oscillate at a frequency at which the amplitude of the local oscillator signal will dominate the amplitude of the self-oscillation signal thereby causing phase locked loop 26 to respond in the correct manner as set forth above.

Transistor 62 will remain conductive for a time primarily determined by the gain characteristics of transistor 62 and the value of capacitor 66, resistor 88 and the impedance presented at the output of mode switch 56. Before the application of the positive-going pulse to the base of transistor 62, transistor 62 is nonconductive and capacitor 66 is charged to a positive voltage, determined by the output voltage of phase detector 38, with the positive potential being at the collector of transistor 62, and is thereafter stored until the application of the positive-going pulse to the base of transistor 62. When transistor 62 is rendered conductive in response to the positive-going pulse coupled to its base, capacitor 66 is discharged through conductive transistor 62. After the positive-going pulse at the base of transistor 62 terminates, capacitor 66 begins to recharge. Assuming that resistor 68 has a relatively large value, substantially all of the charging current flows through the base-emitter circuit of transistor 62, the rate and amplitude being determined by the values of the input impedance of transistor 62 between its base and emitter, the output impedance of transistor 62 between its collector and emitter, capacitor 66, resistor 64, resistor 88 and the output impedance presented at the output of mode switch 56. Because both the output and input impedances of transistor 62 change dynamically with the charging current in a feedback manner typically called bootstrapping, the voltage at the inverting (−) input of operational amplifier 60 rises at a substantially linear rate. When the charging current decreases to a point at which transistor 62 is again rendered nonconductive, the full phase/frequency error signal developed by phase detector 38 is coupled to the inverting (−) input of operational amplifier 60 and normal control is resumed.

The time constant associated with differentiating circuit 86 is desirably selected such that capacitor 66 is fully discharged during the duration of the positive-going pulse. Furthermore, the charging time constant of capacitor 66 is desirably selected to be shorter than the time constant associated with phase locked loop 26, primarily determined by the passive filter elements 92 coupled between the inverting (−) input and output in the feedback path of low pass filter 46, so that the acquisition time of phase locked loop 26 is not significantly lengthened by the operation of lockup inhibiting circuit 58.

With respect to the charging time constant of capacitor 66, it is noted that a capacitor may be coupled between the collector and emitter of transistor 62 in place of capacitor 66. However, this would require a capacitor having a value much larger than the value of capacitor 66. This is so because the location of capacitor 66 takes advantage of the current amplification of transistor 62. A capacitor coupled between the collector and emitter of transistor 62 which would provide approximately the same charging time constant as capacitor 66 would have to have a value approximately equal to the value of capacitor 66 times the forward current gain, typically called beta ($\beta$), of transistor 62. Moreover, a capacitor placed between the collector and emitter of transistor 62 would provide an exponential rather than linear waveform because it would not be arranged in a bootstrapping arrangement.

It is noted that separate networks 94, 96, 98 and 86 each including a series capacitor are provided so as to prevent the simultaneous presence of a positive voltage at more than one input of OR configuration 100 from affecting the operation of lockup inhibiting circuit 58. That is, in tuning systems where one bandswitching control signal may be generated before another is completely removed, if the cathodes of diodes 74, 76 and 78 were coupled to a common junction and then coupled to resistor 68 through a single capacitor rather than being separately coupled to resistor 68 through separate capacitors 104, 106 and 82, a previously applied positive bandswitching control voltage at the output of one of amplifiers 52, 50 and 48 which remained for a short time after a new positive bandswitching control signal was generated could prevent the single differentiating capacitor from discharging since there would be no interval during which a voltage level were not applied to it. Should bandswitch logic 32 however be arranged so that a previously applied bandswitching voltage is removed before another is applied, a common differentiating capacitor could be shared for the outputs of amplifiers 52, 50 and 48. However, a separate capacitor such as 102 would still be needed to isolate supply voltage +V2 since it is always present. It is further noted that since self-oscillations are typically troublesome after a new band has been selected, it may not be necessary to provide means for enabling the operation of lockup inhibiting circuit 58 in response to the initial application of power to the receiver. In this case, network 94 may be omitted. In addition, if the receiver is of the type that a channel is automatically selected when power is applied, a band will be selected when power is applied. Therefore, in these systems, network 94 may also be omitted since lockup inhibiting circuit 58 will be activated in response to the selection of the band.

Lockup inhibiting circuit 58 may be considerably simplified if the self-oscillations are initiated only when the receiver is first turned on. In this situation, OR configuration 100 could be omitted, leaving only the arrangement including transistor 62, capacitor 66 and resistor 64. With this configuration, when power is first turned on, a positive-going step voltage is coupled from the power supply (not shown) of phase detector 38 through phase detector 38 and mode switch 56 to resistor 88, resistor 64, capacitor 66 and the base of transistor 62. The positive supply voltage is differentiated by the circuit including resistor 88, resistor 64, capacitor 66 and the base-emitter circuit of transistor 62 to form a positive-going pulse which renders transistor 62 conductive. Thereafter, transistor 62 and its associated circuitry operate in the above-described manner to initially cause controlled oscillator 16 to operate at a relatively high frequency and after a short interval be normally controlled by phase locked loop 26. With respect to this configuration, it is noted that capacitor 66 serves to couple the positive-going pulse to the base of transistor 62 and therefore should not be coupled between the collector and emitter of transistor 62 as was described above with respect to the embodiment as is shown in the FIGURE.

In addition to these ways of causing controlled oscillator 16 to oscillate at a relatively high frequency so that the local oscillator signal has a sufficiently high amplitude to dominate any self-oscillation signals, it is possible to provide an arrangement to temporarily disconnect the inverting (−) input of operational amplifier 60 from the output of phase detector 38 when power is initially applied to the receiver or when a new band is selected by means of a switch coupled between phase detector 38 and low pass filter 46. In a system such as the one shown in the sole FIGURE including mode switch 56 for selectively coupling an MATV control unit 54 to controlled oscillator 16, this may be conveniently done by coupling the output of the OR circuit 100 to mode switch 56 and by providing a suitable internal timing circuit such as, for example, a monostable multivibrator, to establish the time during which the inverting (−) input of operational amplifier 60 is disconnected from the phase/frequency error signal generated by phase detector 38. While the error signal generated by phase detector 38 is disconnected from the inverting (−) input of operational amplifier 60, the control voltage will be driven to a relatively high level corresponding to a relatively high local oscillator frequency with the desirable results set forth above.

In addition to the advantages set forth above, it is additionally noted that the present lockup inhibiting circuit may be readily added to an existing phase locked loop integrated circuit, for example, such as the CD4046 integrated circuit available from RCA Corporation, without modifying its internal structure because it can be coupled to the input of the active low pass filter which is typically provided externally to the phase locked loop integrated circuit because of its analog circuitry.

What is claimed is:

1. Apparatus for tuning a receiver to various tuning positions comprising:

controlled oscillator means for generating a local oscillator signal having its frequency controlled in response to a control signal, said local oscillator signal having an amplitude also controlled in response to said control signal;

first divider means for dividing the frequency of said local oscillator signal to generate a first frequency divided local oscillator signal, said first divider means being susceptible to oscillating and thereby generating a spurious signal;

phase locked loop means including second divider means for dividing the frequency of said first frequency divided local oscillator signal by a factor determined by a selected one of said tuning positions to generate a second frequency divided local oscillator signal and for generating said control signal in response to the phase and frequency relationship between said second frequency divided signal and a reference frequency signal, said phase locked loop means undesirably responding to said spurious signal rather than to said first frequency divided local oscillator signal when the amplitude of said local oscillator signal falls below a predetermined amplitude; and lockup inhibiting means for temporarily presetting said control signal to a predetermined level to cause the amplitude of said local oscillator signal to exceed said predetermined amplitude in response to an occurrence of at least one predetermined operating condition of said tuning apparatus during which the operation of said controlled oscillator means is initiated and during which the amplitude of said local oscillator signal would otherwise be below said predetermined amplitude and thereafter permitting said control signal to be normally controlled by said phase locked loop means.

2. The apparatus recited in claim 1 wherein said phase locked loop means has an acquisition time in which a predetermined phase and frequency relationship between said second frequency divided signal and said reference frequency signal is established; and said lockup inhibiting means temporarily controls said control signal for a time interval shorter than said acquisition time of said phase locked loop means.

3. The apparatus recited in claim 1 wherein said receiver includes means for applying power thereto; and said lockup inhibiting means is responsive to the application of power to said receiver.

4. The apparatus recited in claim 1 further including band selection means for controlling the frequency band of said local oscillator signal; and wherein said lockup inhibiting means is responsive to the selection of a new band by said band selection means.

5. The apparatus recited claim 1 wherein the frequency and amplitude of said local oscillator signal are directly related to the amplitude of said control signal; and said lockup inhibiting means temporarily causes the amplitude of said control signal to be at a predetermined high level in response to the occurrence of said predetermined operating condition.

6. The apparatus recited in claim 5 wherein said controlled oscillator means includes at least one varactor diode responsive to said control signal.

7. The apparatus recited in claim 5 wherein said phase locked loop means includes phase detector means for generating an error signal representing the relationship between the frequencies of said second frequency divided local oscillator signal and said reference frequency signal; and active low pass fitler means for deriving a substantially DC control signal for said controlled oscillator means from said error signal, said lockup inhibiting means being coupled to said active low pass filter so that said DC control signal is temporarily caused to be at said predetermined level in response to the occurrence of said predetermined operating condition.

8. The apparatus recited in claim 7 wherein said active low pass filter means includes operational amplifier means having first and second input terminals and an output terminal, said error signal being coupled to one of said input terminals, and said DC control signal being developed at said output terminal; and said lockup inhibiting means is coupled to one of said input terminals to temporarily cause said DC control signal to be at said predetermined level.

9. The apparatus recited in claim 8 wherein said error signal is coupled to said first input terminal and a fixed potential is coupled to said second terminal; and said lockup inhibiting means causes the potential at said first input terminal to temporarily change in response to the occurrence of said predetermined operating condition so that said DC output signal attains said predetermined level.

10. The apparatus recited in claim 9 wherein said lockup inhibiting means includes switching means for temporarily shunting said first input terminal.

11. The apparatus recited in claim 10 wherein said lockup inhibiting means includes a semiconductor device having first and second electrodes defining ends of a conduction path and a control electrode for controlling the conduction of said conduction path, said conduction path being coupled in shunt with said first input terminal, said transistor being rendered conductive in response to the occurrence of said predetermined conditions; and timing means coupled to said semiconductor for determining the duration of its conduction after the occurrence of the predetermined condition.

12. The apparatus recited in claim 11 wherein said timing means includes capacitor means coupled in bootstrap fashion between said control electrode and one of said first and second electrodes.

13. The apparatus recited in claim 11 further including power supplying means for applying power to said receiver, said power supplying means being coupled to said control electrode through said timing means so that said semiconductor is rendered conductive in response to the application of power to said receiver.

14. The apparatus recited in claim 11 further including band selection means for controlling the frequency band of said local oscillator signal; said band selection means being coupled to said control electrode so that said semiconductor device is rendered conductive in response to the selection of a new band by said band selection means.

15. The apparatus recited in claim 9 wherein said phase locked loop means includes means to temporarily decouple said error signal from said first input terminal in response to the occurrence of said predetermined condition.

16. The apparatus recited in Claim 15 wherein said phase locked loop means includes means for selectively decoupling said error signal from said active low pass filter means and coupling means for controlling said controlled oscillator means to tune a nonstandard frequency signal to said active low pass filter means, said means for selectively decoupling said error signal from said active low pass filter means also being responsive to the occurrence of said predetermined conditions to temporarily decouple said error signal from said active low pass filter means.

* * * * *

UNITED STATES PATENT AND TRADEMARK OFFICE
CERTIFICATE OF CORRECTION

PATENT NO. : 4,110,693

DATED : August 29, 1978

INVENTOR(S) : Wayne Wheeler Evans

It is certified that error appears in the above-identified patent and that said Letters Patent is hereby corrected as shown below:

Column 1, line 26, that portion reading "frequency in" should read -- frequency swept in --; Column 3, line 15 (equation 1), that portion reading "$f_{LO} = NK/Rf_{REF}$" should read -- $f_{LO} = \frac{NK}{R} f_{REF}$ --.

*Signed and Sealed this*

*Tenth* Day of *April 1979*

[SEAL]

Attest:

RUTH C. MASON
*Attesting Officer*

DONALD W. BANNER
*Commissioner of Patents and Trademarks*